United States Patent
Wu et al.

(10) Patent No.: US 7,052,285 B2
(45) Date of Patent: May 30, 2006

(54) ELECTRODE MOUNTING STRUCTURE AND FLAT PANEL DISPLAY EMPLOYING THE SAME

(75) Inventors: Jiun-Han Wu, Sanchong (TW); Po-Cheng Chen, Yonghe (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 10/819,323

(22) Filed: Apr. 6, 2004

(65) Prior Publication Data

US 2005/0153599 A1    Jul. 14, 2005

(30) Foreign Application Priority Data

Jan. 8, 2004    (TW) ............... 93100416 A (51) Int. Cl.
*H01R 12/00*    (2006.01)
*H05K 1/00*    (2006.01)

(52) U.S. Cl. ........................................ 439/67

(58) Field of Classification Search ......... 439/67, 439/91

See application file for complete search history.

(56) References Cited

U.S. PATENT DOCUMENTS

| | | | |
|---|---|---|---|
| 4,113,981 A * | 9/1978 | Fujita et al. ........ | 174/88 R |
| 4,999,460 A * | 3/1991 | Sugiyama et al. .... | 174/94 R |

* cited by examiner

*Primary Examiner*—Javaid H. Nasri
(74) *Attorney, Agent, or Firm*—Thomas, Kayden, Horstemeyer & Risley (57) ABSTRACT

An electrode mounting structure and a flat panel display employing the same. Bonding electrodes, board electrodes, and an anisotropic conductive adhesive layer are all provided. Bonding strength and reliability of the electrode mounting structure are improved by the anisotropic conductive adhesive layer completely covering bonding electrode exposure areas after thermal compression, bonding the bonding electrodes and the board electrodes.

16 Claims, 8 Drawing Sheets

ELECTRODE MOUNTING STRUCTURE AND FLAT PANEL DISPLAY EMPLOYING THE SAME

BACKGROUND OF THE INVENTION

1. Field of the Invention

The present invention relates to an electrode mounting structure, and more specifically to an electrode mounting structure for a flat panel display.

2. Description of the Related Art

Flat panel displays (FPD), such as liquid crystal displays (LCD), organic light emitting diodes (OLED) and plasma display panels (PDP), are rapidly replacing cathode ray tubes (CRT). Plasma display panels are self-emitting, highly luminous, wider viewing angle, and simpler fabrication process, making them a frequent choice in display industry.

In the manufacturing process of a plasma display panel, a front substrate is fixed to a rear substrate with discharge cells formed therebetween. A plurality of circuit board electrodes are then connected with corresponding bonding electrodes on bonding areas of the front and rear substrates for control of the discharge cells. The circuit board electrodes connect with other electrical devices, thereby quality of the PDP is affected by bonding strength and reliability of the mounting structure between the circuit board electrodes and bonding electrodes.

Figure 1:
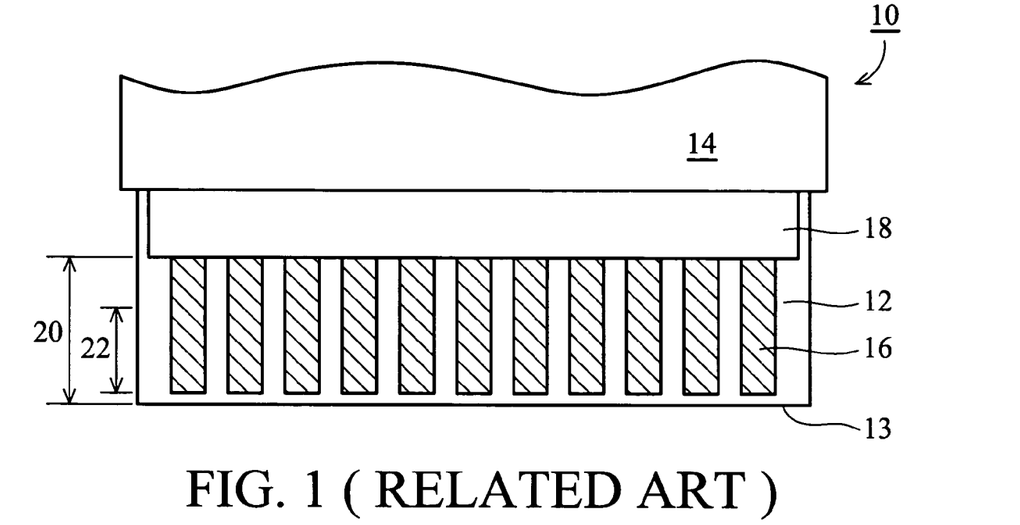
FIG. 1 is a top view of the front substrate and the rear substrate of a conventional PDP after bonding illustrating the bonding area.

FIG. 1 is a top view of a bonding area in a front substrate in a conventional PDP. PDP 10 comprises a front substrate 12 and a rear substrate 14 aligned therewith. A plurality of bonding electrodes 16 are formed between the substrates and extend to an edge 13 of the front substrate 12. A dielectric layer 18 is formed on the front substrate 12 to expose a bonding area 20 with bonding electrodes 16 exposed by the rear substrate 14 and the dielectric layer 18. The bonding area 20 comprising a predetermined circuit board electrode area 22 electrically connects a circuit board.

Figure 2:
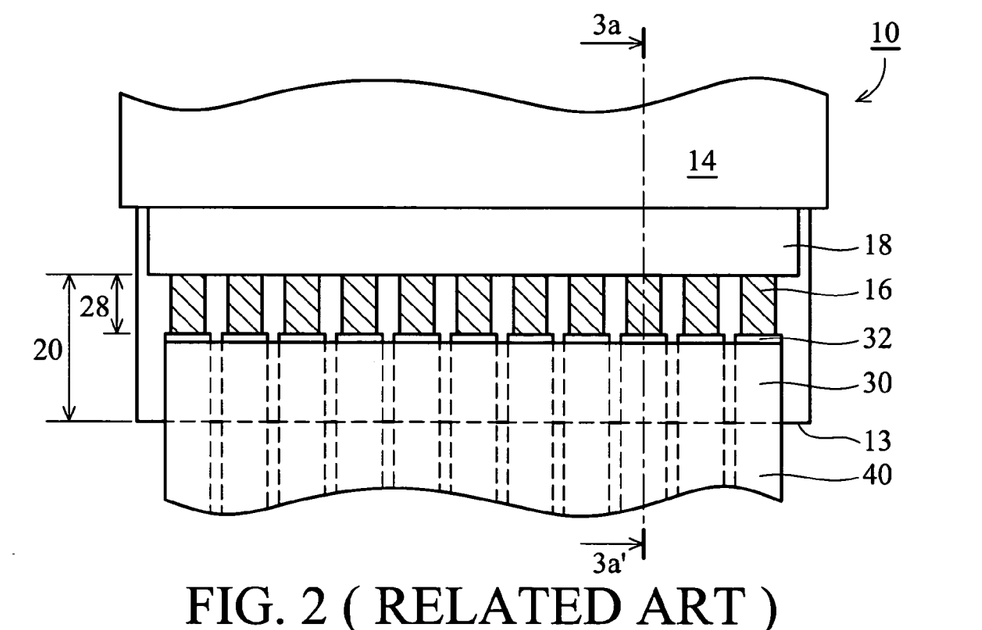
FIG. 2 is a top view of a conventional mounting structure of PDP.
Figure 3A:
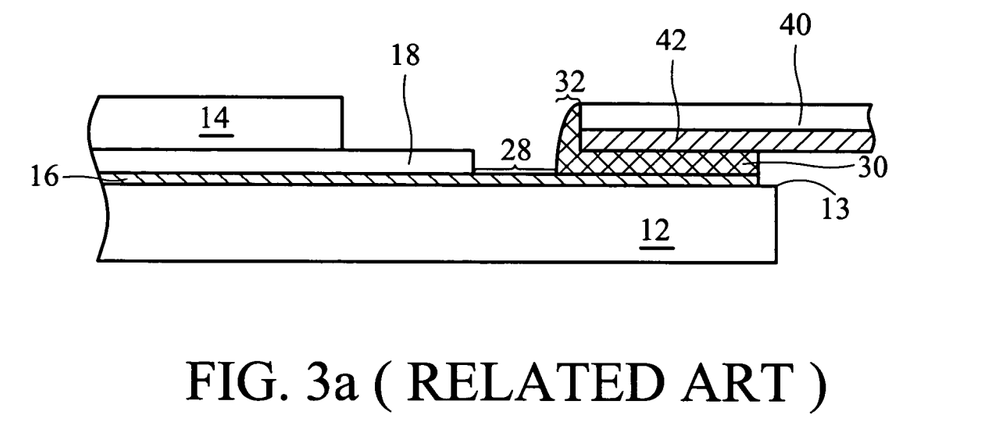
FIGS. 3a and 3b are sectional diagrams of FIG. 2 along line 3a–3a' illustrating a conventional mounting process.
Figure 3B:
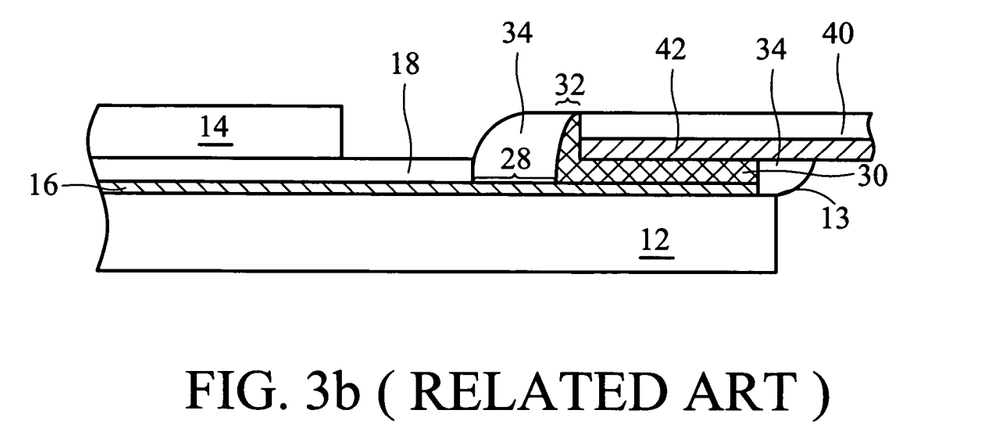

FIG. 2 is a top view of a circuit board 40 bonded with the front substrate 12 by a conductive layer 30 formed on the predetermined board electrode area 22, and FIGS. 3a and 3b are sectional diagrams of FIG. 2 along line 3a–3a' illustrating the mounting process. As shown in FIGS. 2 and 3a, the circuit board 40 is positioned on the predetermined board electrode area 22, wherein each circuit board electrode 42 of the circuit board 42 corresponds to a bonding electrode 16 of the front substrate 12. After thermal compression bonding, circuit board electrodes 42 are bonded and electrically connected to the corresponding bonding electrodes 16 by the conductive layer 30. However, since the conductive layer 30 is only formed on the predetermined board electrode area 22 between the two electrodes, a bonding electrode exposure area 28 is exposed on the bonding area 22 beyond the conductive layer 30 and a spill area 32 of the conductive layer 30 formed by the thermal compression process. Thus, referring to FIG. 3b, a silicon paste 34 covers the bonding electrode exposure area 28 in order to protect bonding electrodes 16 from moisture and air. However, due to the essential silicon paste and the mean bonding strength between the substrate and the circuit broad, this method increases processing time and reduces reliability.

SUMMARY OF THE INVENTION

Accordingly, an object of the present invention is to provide an electrode mounting structure for flat plane display providing improved bonding strength between the substrate and the circuit board thereof, with increased the reliability of the electrode mounting structure.

Another object of the present invention is to provide a flat plane display having the electrode mounting structure according to the present invention, eliminating instabilities resulting from circuit board peeling.

To achieve the above objects, according to the present invention, an electrode mounting structure comprises a first substrate having a bonding area along an edge thereof, a plurality of bonding electrodes formed on the bonding area, an anisotropic conductive adhesive layer formed on the bonding area to completely cover all bonding electrode surfaces, and a circuit board having a plurality of board electrodes formed on the anisotropic conductive adhesive layer.

In the present invention, the board electrodes of the circuit board are tightly bonded to the corresponding bonding electrodes by the anisotropic conductive adhesive layer, electrically connecting therebetween.

The electrode mounting structure can further comprise a protective adhesive layer formed between the first substrate and the circuit board, wherein the protective adhesive layer covers the anisotropic conductive adhesive layer to protect the anisotropic conductive adhesive layer from air and moisture. Moreover, an isolation layer can be formed on the first substrate adjacent to the bonding area.

In the present invention, a flat plane display having the electrode mounting structure comprises a first substrate having a bonding area along an edge thereof, a plurality of bonding electrodes formed on the first substrate and the bonding area, a second substrate formed on the first substrate outside the bonding area, an anisotropic conductive adhesive layer formed on the bonding area to completely cover all bonding electrode surfaces, and a circuit board having a plurality of board electrodes formed on the anisotropic conductive adhesive layer, wherein the board electrodes are tightly bond to the corresponding bonding electrodes by the anisotropic conductive adhesive layer, electrically connecting therebetween.

According to the present invention, the first substrate or the second substrate is a front substrate of the flat panel display and the other the rear.

In the present invention, when the bonding electrodes are silver-containing electrodes serving as thick-film electrodes, the anisotropic conductive adhesive layer covering the bonding electrodes and the protective adhesive layer prevents Ag migration due to moisture. Furthermore, when the bonding electrodes are thin-film electrodes, the anisotropic conductive adhesive layer protects the bonding electrodes from moisture and air.

A detailed description is given in the following embodiments with reference to the accompanying drawings.

BRIEF DESCRIPTION OF THE DRAWINGS

The present invention can be more fully understood by reading the subsequent detailed description in conjunction with the examples and references made to the accompanying drawings, wherein:

FIGS. 5 to 6c are sectional diagrams of FIG. 4a along line 5-5' of the mounting structures according to the present invention.

DETAILED DESCRIPTION OF THE INVENTION

One feature of the present invention is use of an anisotropic conductive adhesive layer covering the entire surface of the bonding electrode exposure area, resulting in high reliability of the electrode mounting structure. Moreover, the anisotropic conductive adhesive layer can further extend to the edge toward the circuit board of the substrate to improve the bonding strength of the electrode mounting structure.

Figure 4A:
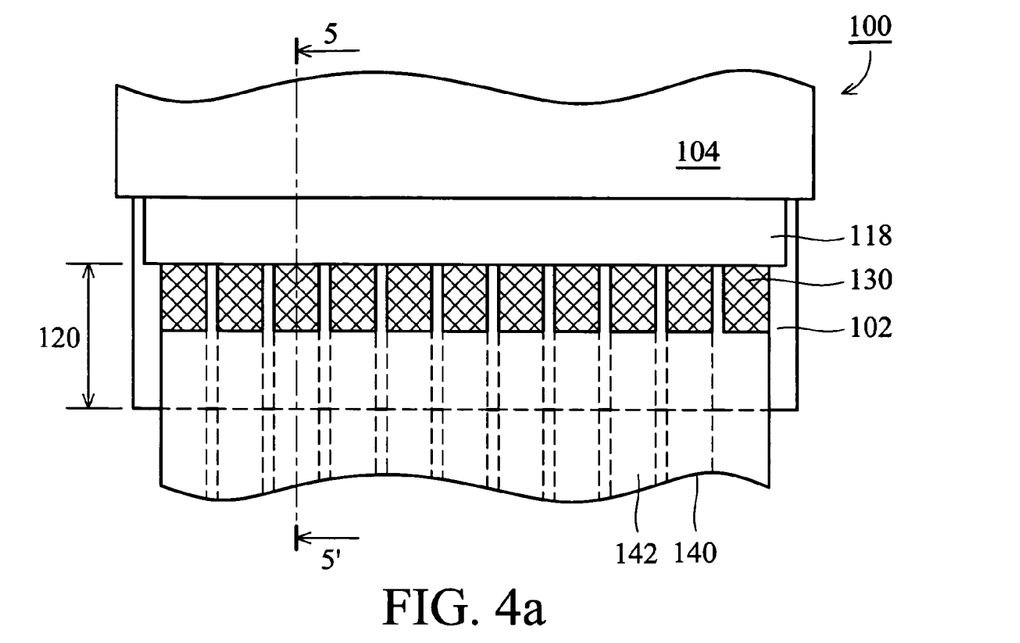
FIGS. 4a to 4c are top views of the mounting structures according to the present invention.

While a PDP is used to illustrate the invention more fully, numerous modifications and variations will be apparent to those skilled in the art. FIG. 4a is a top view of the electrode mounting structure of the PDP.

The PDP 100 comprises a first substrate 102 and a second substrate 104 aligned therewith. Herein, a bonding area 120 on the first substrate is used to illustrate the electrode mounting structure. The bonding area 120 is located on the first substrate 102 outside the second substrate 104. A plurality of bonding electrodes (not shown in the FIG. 4a) are formed on the bonding area 120 parallel to each other. Moreover, in order to protect the bonding electrodes 116 between the first substrate 102 and the second substrate 104, an insulation layer 118 can be located therebetween exposing the bonding area 120. The insulation layer 118 can be a dielectric layer. Preferably, the bonding electrodes are alloy or laminates of chromium, copper, aluminum, nickel, cobalt, tungsten or a combination thereof, and can be fabricated by a method such as thick-film process, thin-film process, or screen printing.

Figure 4B:
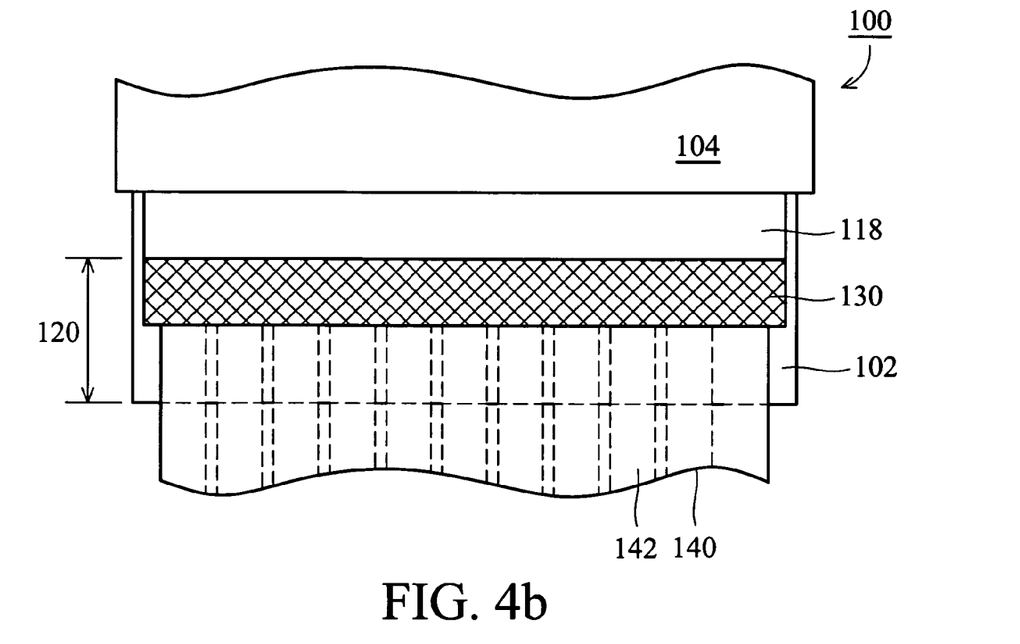
Figure 4C:
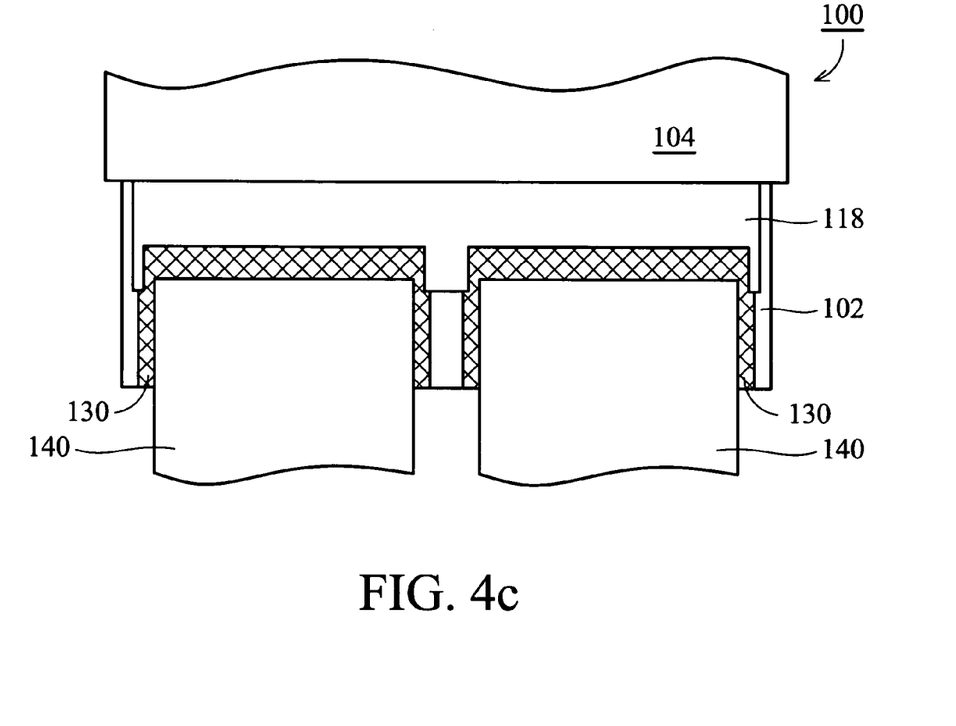
Figure 5:
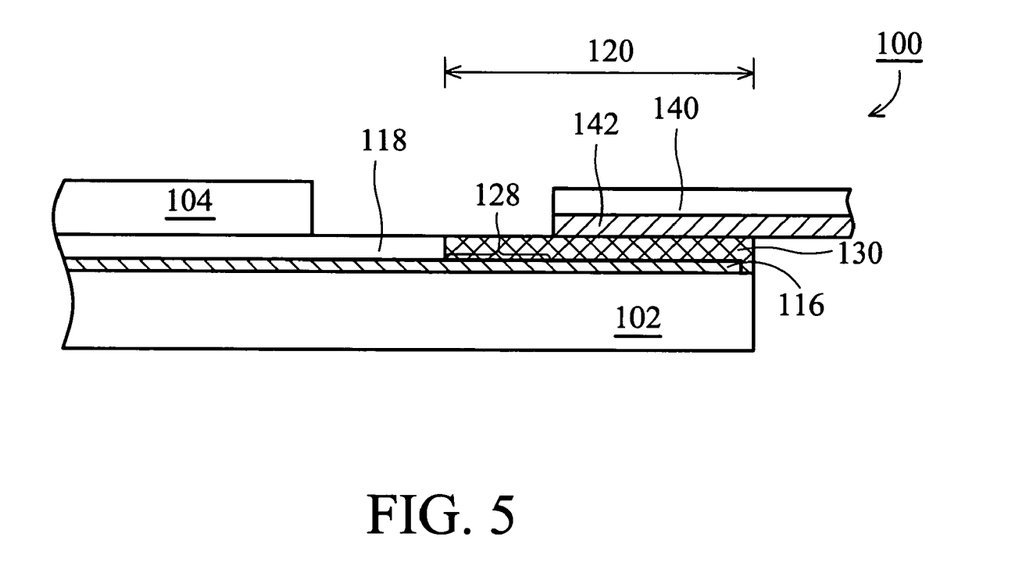

FIG. 5 is a sectional diagram of FIG. 4a along line 5-5' illustrating the mounting structure according to the present invention. The electrode mounting structure further comprises a circuit board 140 bonded to the first substrate 102 by a plurality of anisotropic conductive adhesive layers 130. The circuit board 140 comprises a plurality of board electrodes 142 formed thereon, and each board electrode is bonded and electrically connected to the corresponding bonding electrode 116 by the anisotropic conductive adhesive layer 130. Preferably, the circuit board 140 is a flexible printed circuit (FPC). In the present invention, the anisotropic conductive adhesive layers 130 are formed to cover all surfaces of bonding electrode 116 of the bonding area 120. Moreover, the bonding electrode exposure area 128 is completely covered by the anisotropic conductive adhesive layer 130 after thermal compression bonding, resulting in increased bonding strength and reliability of the electrode mounting structure. Moreover, when the bonding electrodes 116 are thin-film electrodes, the anisotropic conductive adhesive layer protects bonding electrodes from moisture and air. Furthermore, the anisotropic conductive adhesive layers 130 can be connected to each other as shown in FIG. 4b. As well, the electrode mounting structure can comprise an insulation layer 118 with non-straight edges, as shown in FIG. 4c.

In the present invention, the anisotropic conductive adhesive layers 130 comprising conductive particles can be formed by coating anisotropic conductive adhesives or pasting anisotropic conductive films (ACF) on the bonding area 120. When the board electrodes 142 are thermally compressed to the corresponding bonding electrodes with the anisotropic conductive adhesive layers 130, a z-axis electrically conductive pathway is formed. The anisotropic conductive adhesive layers 130 do not conduct in the x-y plane, thereby isolating the adjacent pathways. Preferably, the conductive particles are deformable metal spheres plated with gold, silver or nickel. The board electrodes 142 can be connected to the bonding electrodes 116 by anisotropic conductive adhesive layers 130 by a method such as tape automated bonding (TAB) process or chip on film (COF) process.

Figure 6A:
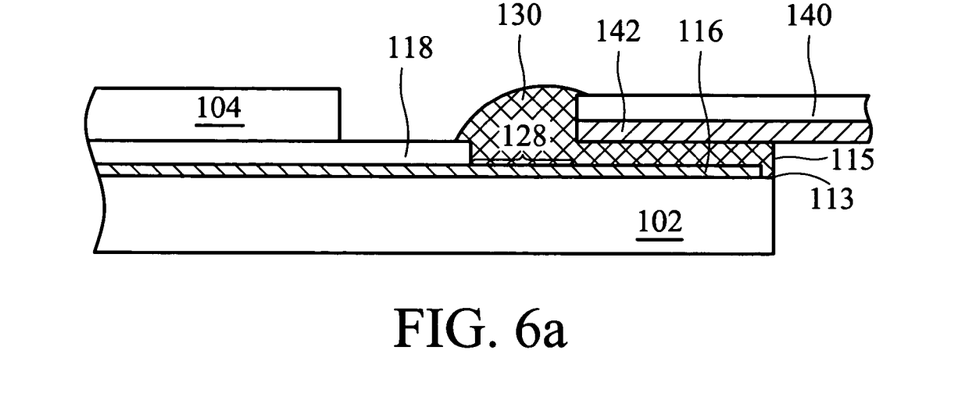
Figure 6B:
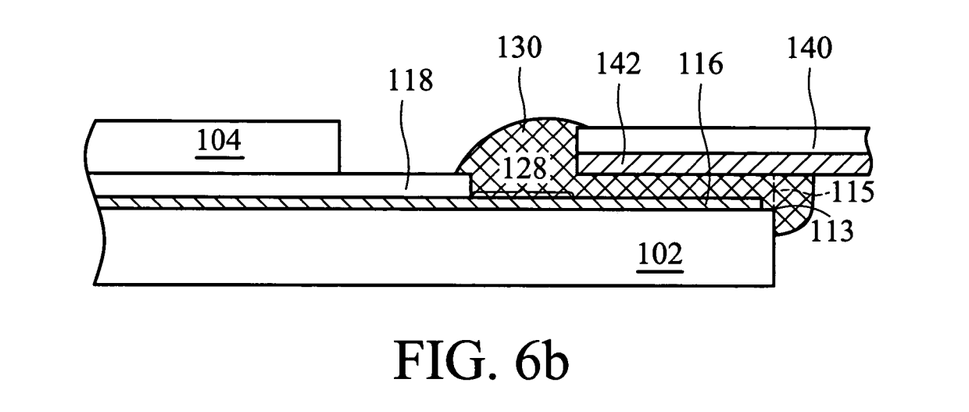
Figure 6C:
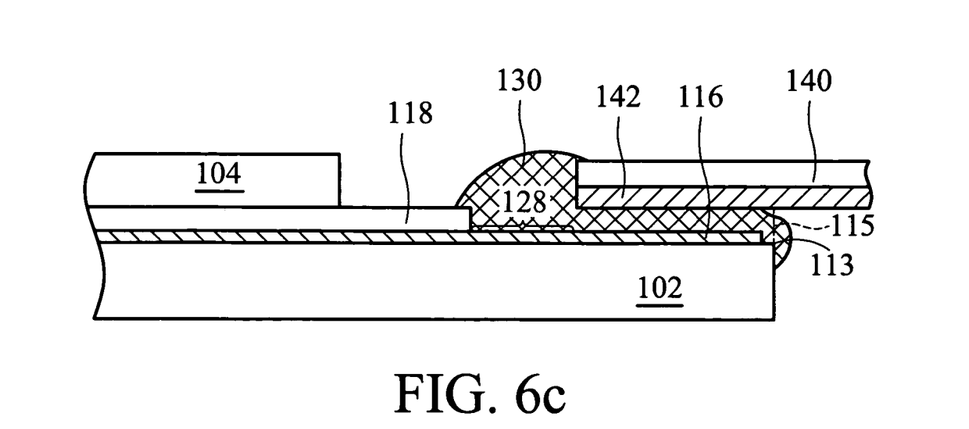

FIGS. 6a to 6c are cross sections illustrating the electrode mounting structure according to the present invention. Anisotropic conductive adhesive layer 130 is formed on the first substrate 102 to completely cover the bonding electrode 116. The layer 130 can be further formed on a part of the insulation layer 118 and the circuit board 140 after thermal compression bonding, as shown in FIG. 6a. Moreover, as shown in FIGS. 6b and 6c, the anisotropic conductive adhesive layer 130 can be formed between the first substrate 102 and the circuit board 140 to extend to the edge 113 of the first substrate 102 in order to further improve the bonding strength of the electrode mounting structure.

Figure 7:
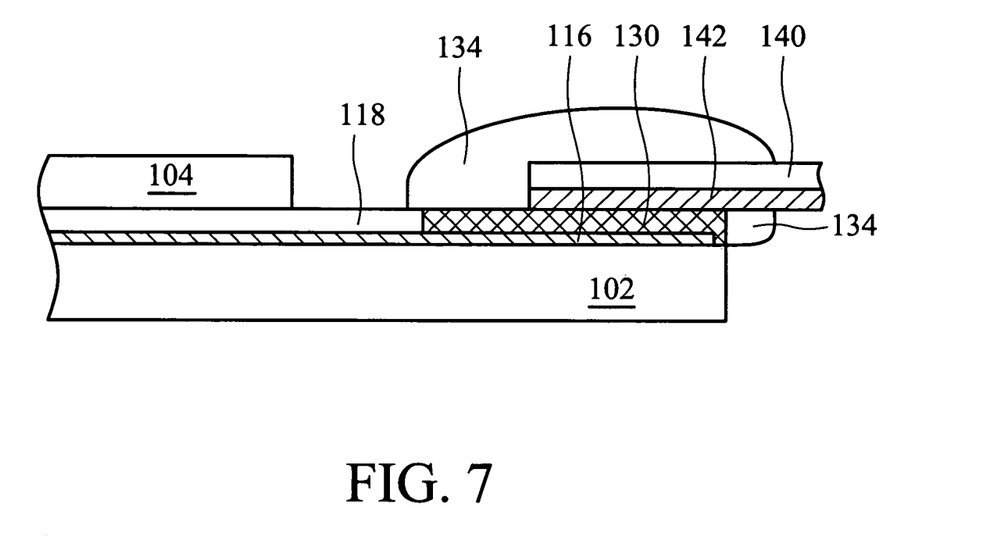
FIG. 7 is a cross section of the mounting structure according to the present invention, further comprising a protective adhesive layer formed thereon.

In the present invention, when the bonding electrodes 116 are thick-film electrodes such as silver electrodes, the electrode mounting structure further comprises a protective adhesive layer 134 formed on the anisotropic conductive adhesive layer 130 and board electrodes 142 preventing the bonding electrodes 116 from Ag migration due to moisture and air, as shown in FIG. 7.

Figure 8:
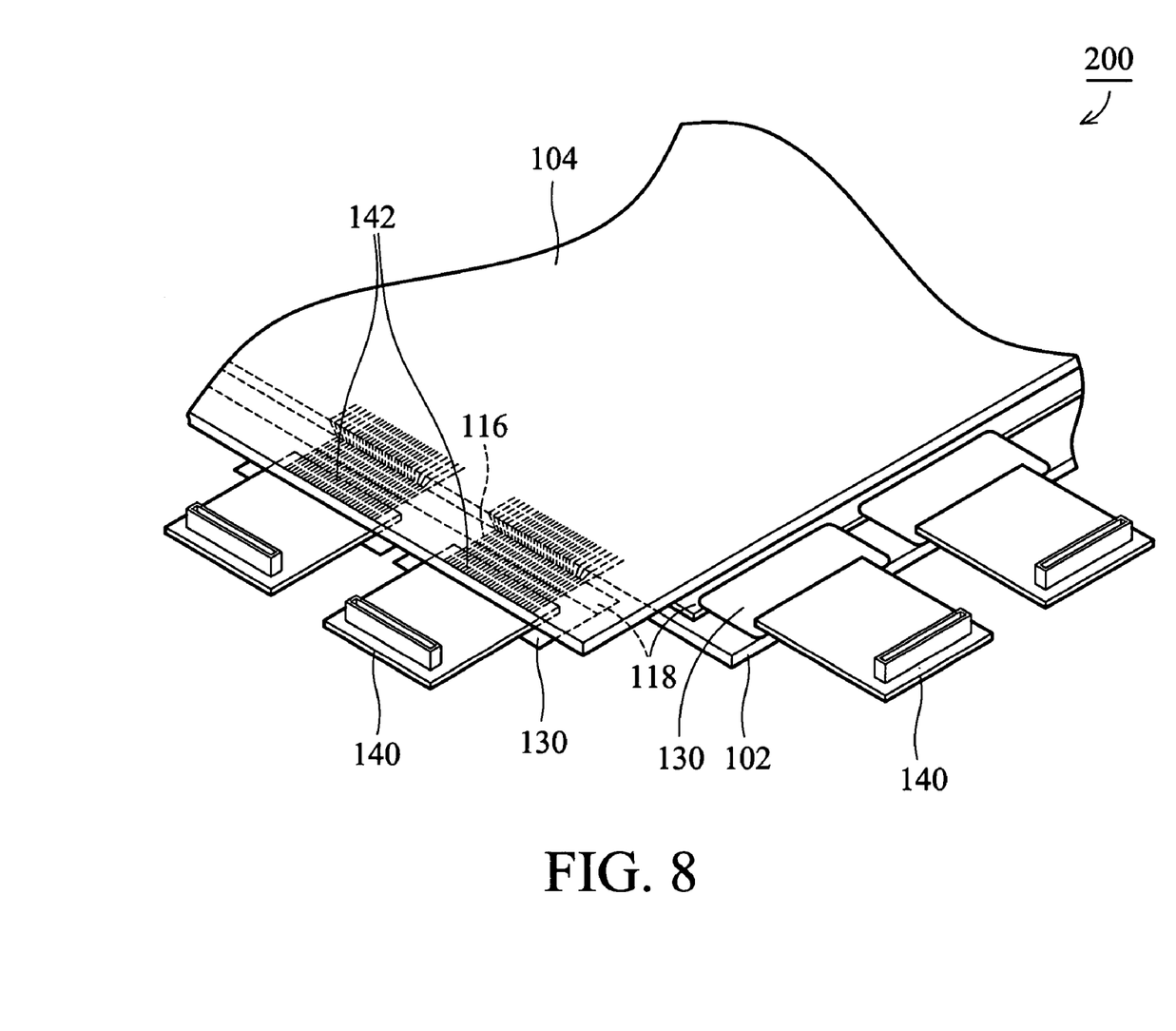
FIG. 8 is a partial perspective view of the flat plane display according to the present invention.

FIG. 8 is a partial perspective view of the flat plane display 100. According to the flat plane display 100, the first substrate 102 is the front substrate of the PDP and the second substrate the rear. The electrode mounting structure according to the present invention can not only bond the board electrodes 142 and the bonding electrodes 116 of the front substrate 102, but also the board electrodes 142 and the bonding electrodes 116 of the rear substrate 104. Namely, as shown in FIG. 8, the mounting structure according to the present invention is suitable for bonding the circuit board to the front or rear substrate.

Accordingly, the electrode mounting structures according to the present invention provides improved bonding strength and increased reliability, when compared to the related art. Moreover, the mounting structure is not only suitable for PDP, but also for FPD such as OLED or LCD to eliminate instabilities resulting from circuit board peeling.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrode mounting structure, comprising:
   a first substrate and a second substrate formed on the first substrate, wherein a exposed area is located on the first substrate outside the second substrate;

a plurality of bonding electrodes formed on the exposed area;

an anisotropic conductive adhesive layer and an isolation layer completely covering the exposed area; and a circuit board comprising a plurality of board electrodes on the anisotropic conductive adhesive layer, wherein the board electrodes are tightly bonded to the corresponding bonding electrodes by the anisotropic conductive adhesive layer, electrically connecting there between.

2. The electrode mounting structure as claimed in claim 1, further comprising a protective adhesive layer between the first substrate and the circuit board, wherein the protective adhesive layer covers the anisotropic conductive adhesive layer.

3. The electrode connection structure as claimed in claim 1, wherein the circuit board is a flexible printed circuit (FPC).

4. The electrode mounting structure as claimed in claim 1, wherein the anisotropic conductive adhesive layer is an anisotropic conductive film (ACF).

5. The electrode mounting structure as claimed in claim 1, wherein the isolation layer is a dielectric layer.

6. The electrode mounting structure as claimed in claim 1, wherein the anisotropic conductive adhesive layer is formed between the first substrate and the circuit board to extend to the edge of the first substrate.

7. A flat panel display, comprising:

a first substrate and a second substrate formed on the first substrate, wherein a exposed area is located on the first substrate outside the second substrate, and the first substrate or the second substrate acts a front substrate of the fiat panel display and the other acts as a rear substrate of the flat panel display;

a plurality of bonding electrodes formed on the first substrate and the exposed area;

an anisotropic conductive adhesive layer and an isolation layer completely covering the exposed area; and a circuit board comprising a plurality of board electrodes formed on the anisotropic conductive adhesive layer, wherein the board electrodes are tightly bonded to the corresponding bonding electrodes by the anisotropic conductive adhesive layer, electrically connecting therebetween.

8. The flat panel display as claimed in claim 7, wherein the circuit board is a flexible printed circuit (FPC) board.

9. The flat panel display as claimed in claim 7, wherein the anisotropic conductive adhesive layer is an anisotropic conductive film (ACF).

10. The flat panel display as claimed in claim 7, wherein the bonding electrodes are thick-film electrodes.

11. The flat panel display as claimed in claim 7, wherein the bonding electrodes are silver-containing electrodes.

12. The flat panel display as claimed in claim 7, further comprising a protective adhesive layer between the first substrate and the circuit board, wherein the protective adhesive layer covers the anisotropic conductive adhesive layer.

13. The flat panel display as claimed in claim 7, wherein the bonding electrodes are thin-film electrodes.

14. The flat panel display as claimed in claim 7, wherein the bonding electrodes are alloy or laminates chromium, copper, aluminum, nickel, cobalt, tungsten, or a combination thereof.

15. The flat panel display as claimed in claim 7, wherein the isolation layer is a dielectric layer.

16. The flat panel display as claimed in claim 7, wherein the anisotropic conductive adhesive layer is formed between the first substrate and the circuit board to extend to the edge of the first substrate.

* * * * *